United States Patent
de Swiet

(10) Patent No.: US 7,068,034 B2
(45) Date of Patent: Jun. 27, 2006

(54) SQUASHED LIQUID NMR SAMPLE TUBES AND RF COILS

(75) Inventor: Thomas de Swiet, Redwood City, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/967,952

(22) Filed: Oct. 19, 2004

(65) Prior Publication Data

US 2005/0077900 A1    Apr. 14, 2005

(51) Int. Cl.
*G01V 3/00* (2006.01)
(52) U.S. Cl. .................................... 324/321
(58) Field of Classification Search ............... 324/321
See application file for complete search history.

(56) References Cited

U.S. PATENT DOCUMENTS

| | | | | |
|---|---|---|---|---|
| 5,192,911 A | * | 3/1993 | Hill et al. ............... | 324/322 |
| 5,552,709 A | * | 9/1996 | Anderson ............... | 324/321 |
| 5,867,026 A | * | 2/1999 | Haner ..................... | 324/321 |
| 6,674,285 B1 | * | 1/2004 | Haner ..................... | 324/318 |
| 6,774,634 B1 | * | 8/2004 | Cosman .................. | 324/321 |
| 6,828,791 B1 | * | 12/2004 | Morita et al. ........... | 324/318 |
| 6,897,657 B1 | * | 5/2005 | Okada et al. ........... | 324/321 |

* cited by examiner

*Primary Examiner*—Diego Gutierrez
*Assistant Examiner*—Dixomara Vargas
(74) *Attorney, Agent, or Firm*—Bella Fishman; Edward H. Berkowitz

(57) ABSTRACT

Nuclear magnetic resonance (NMR) systems and methods employing squashed (transversely-elongated) sample vessels (sample tubes or flow cells) for holding liquid NMR samples, and matching squashed saddle-shaped RF coils allow reducing sample and/or coil losses and increasing the RF circuit quality factors (Q). In a present implementation, the RF coils and sample vessels have rectangular cross-sections. Rounded (e.g. ellipsoidal) or other squashed cross-sections may also be used. The coil corresponding to the highest sample losses is positioned such that the magnetic field generated by the coil is along the major axis of the sample vessel. Squashed sample vessels may also be used with conventional circular coils, particularly for low-temperature measurements where sample losses dominate.

10 Claims, 12 Drawing Sheets

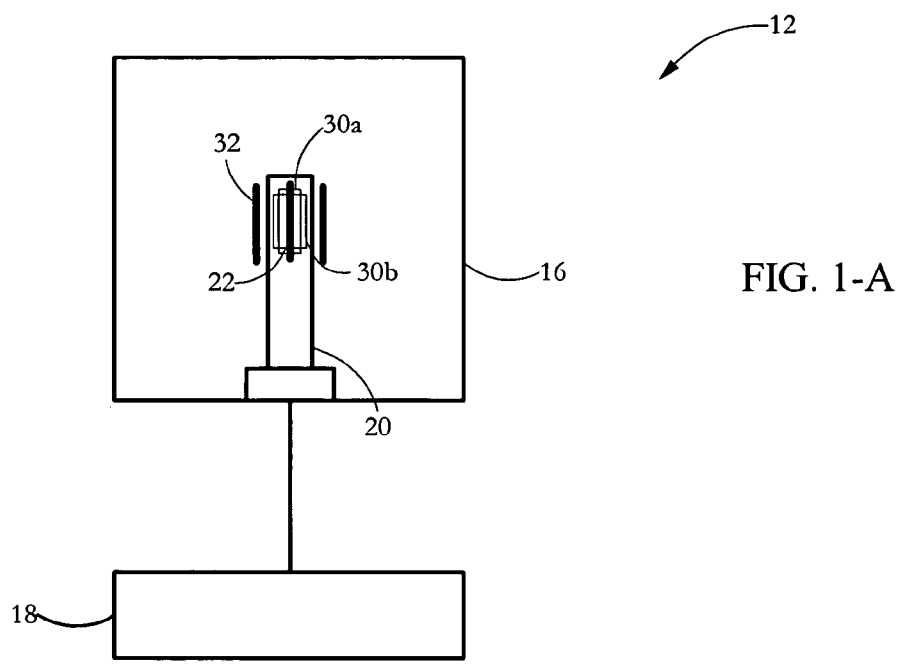
FIG. 1-A
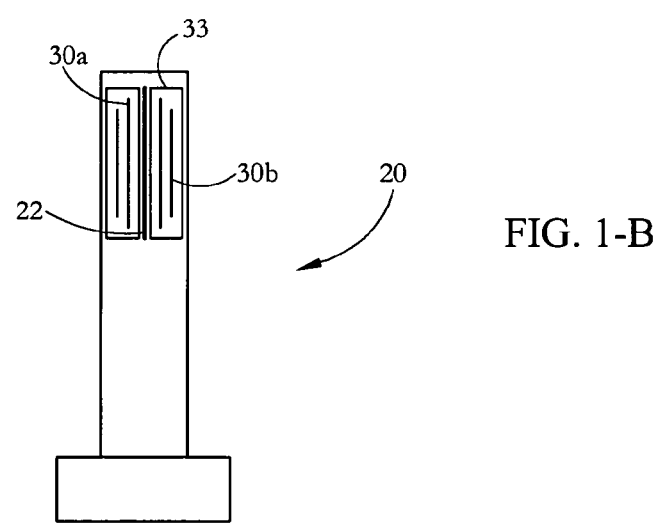
FIG. 1-B

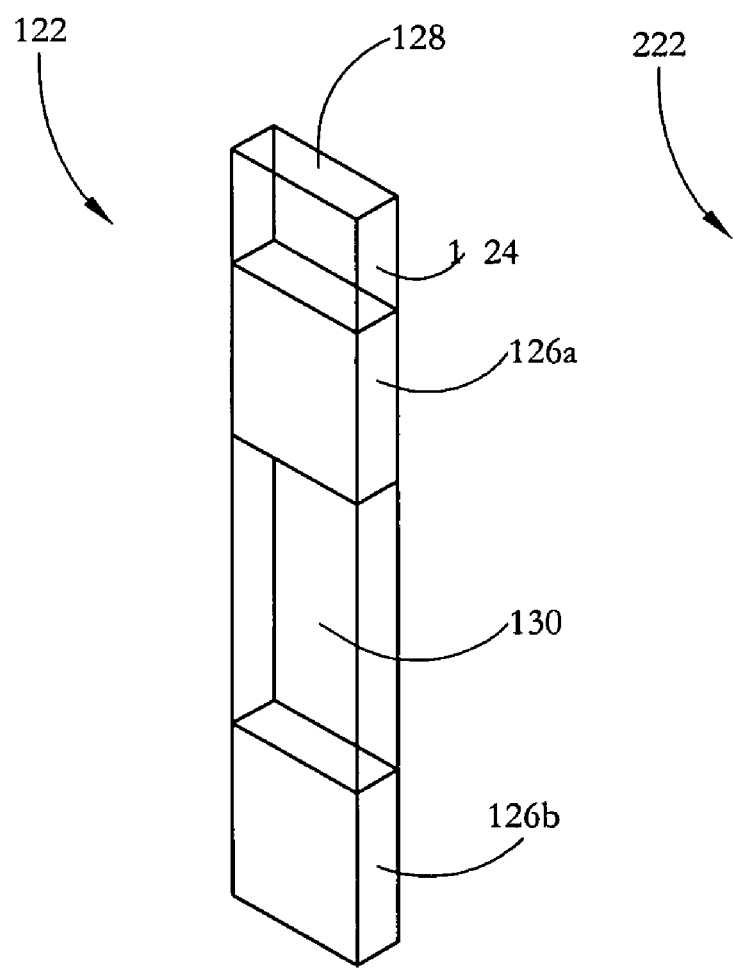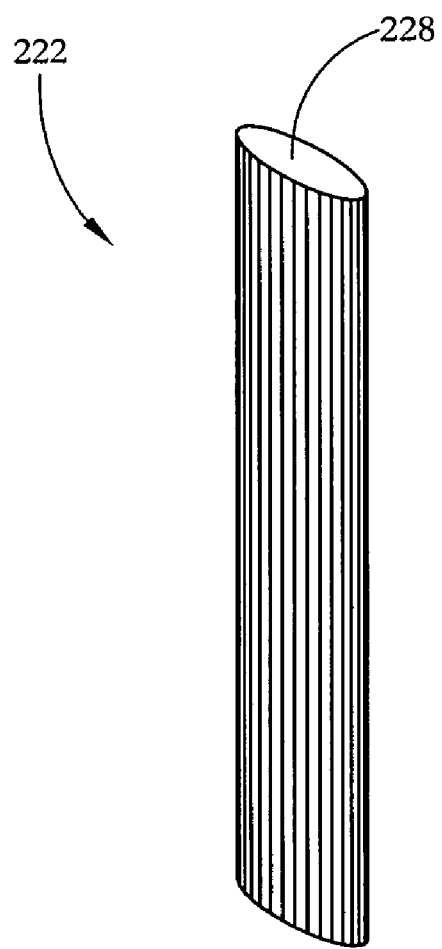
FIG. 2-A            FIG. 2-B

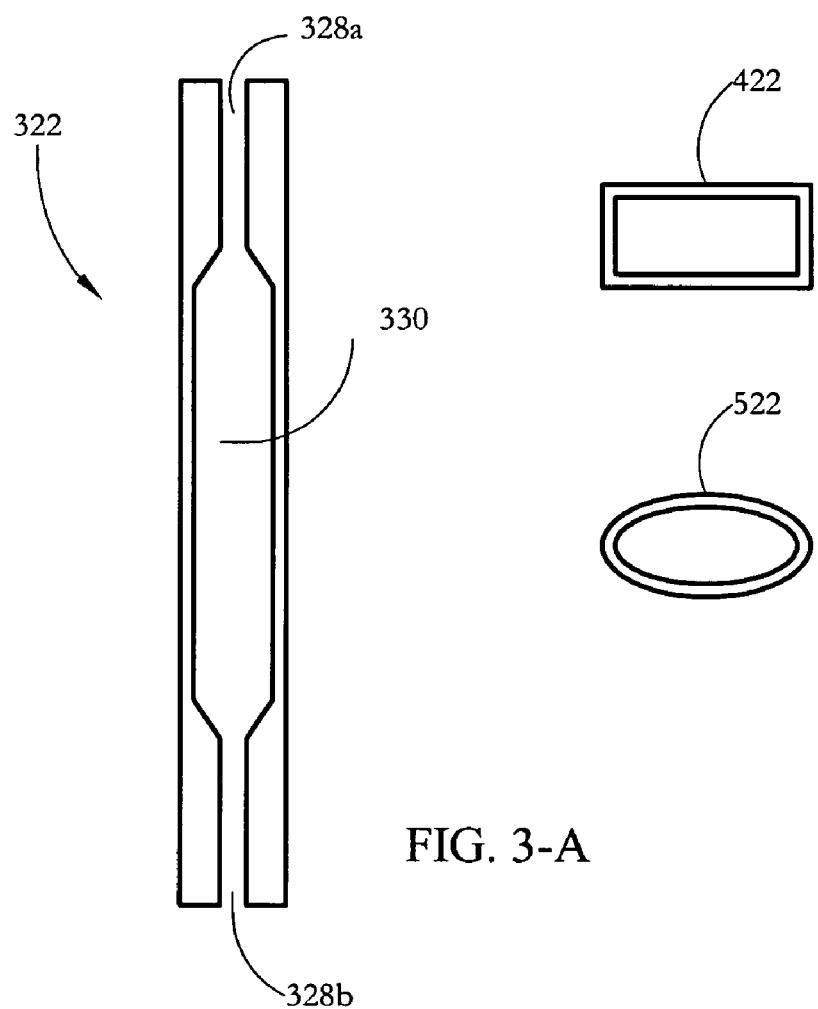
FIG. 3-A
FIG. 3-B
FIG. 3-C

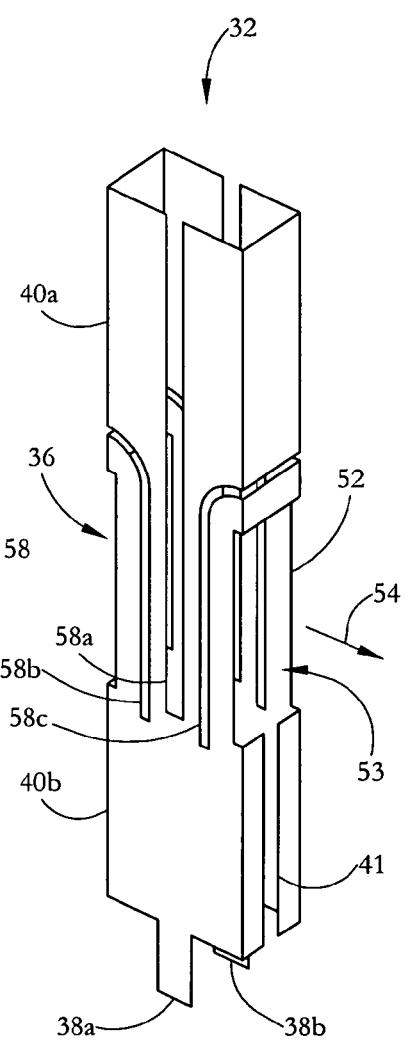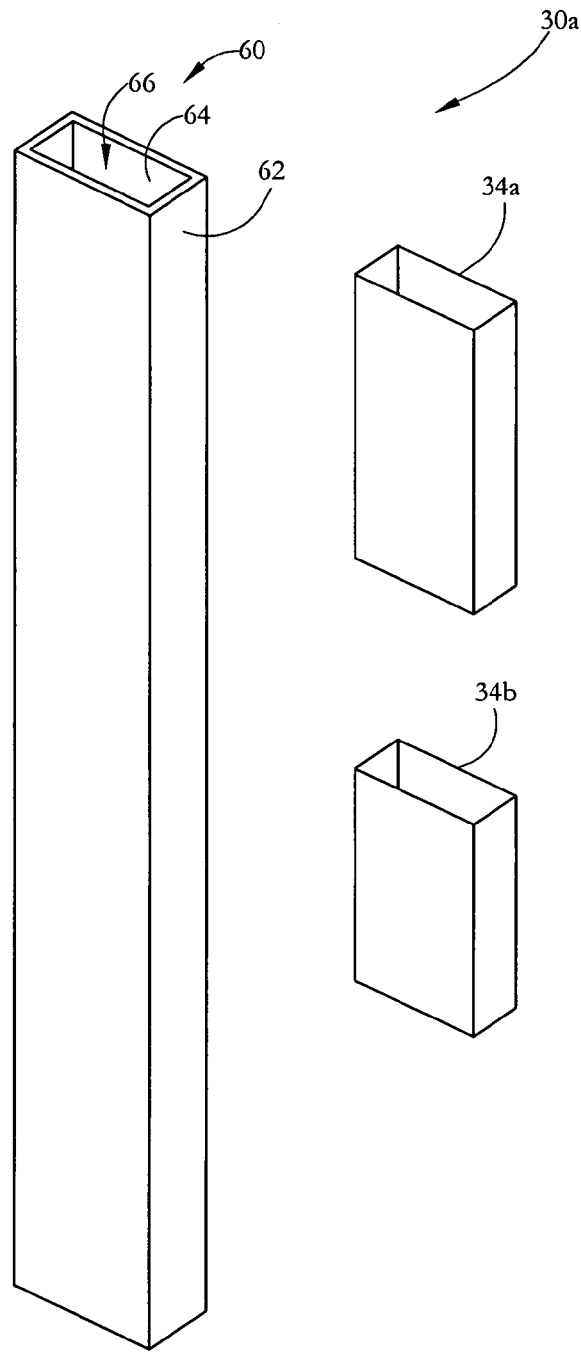
FIG. 4-A  FIG. 4-B  FIG. 4-C

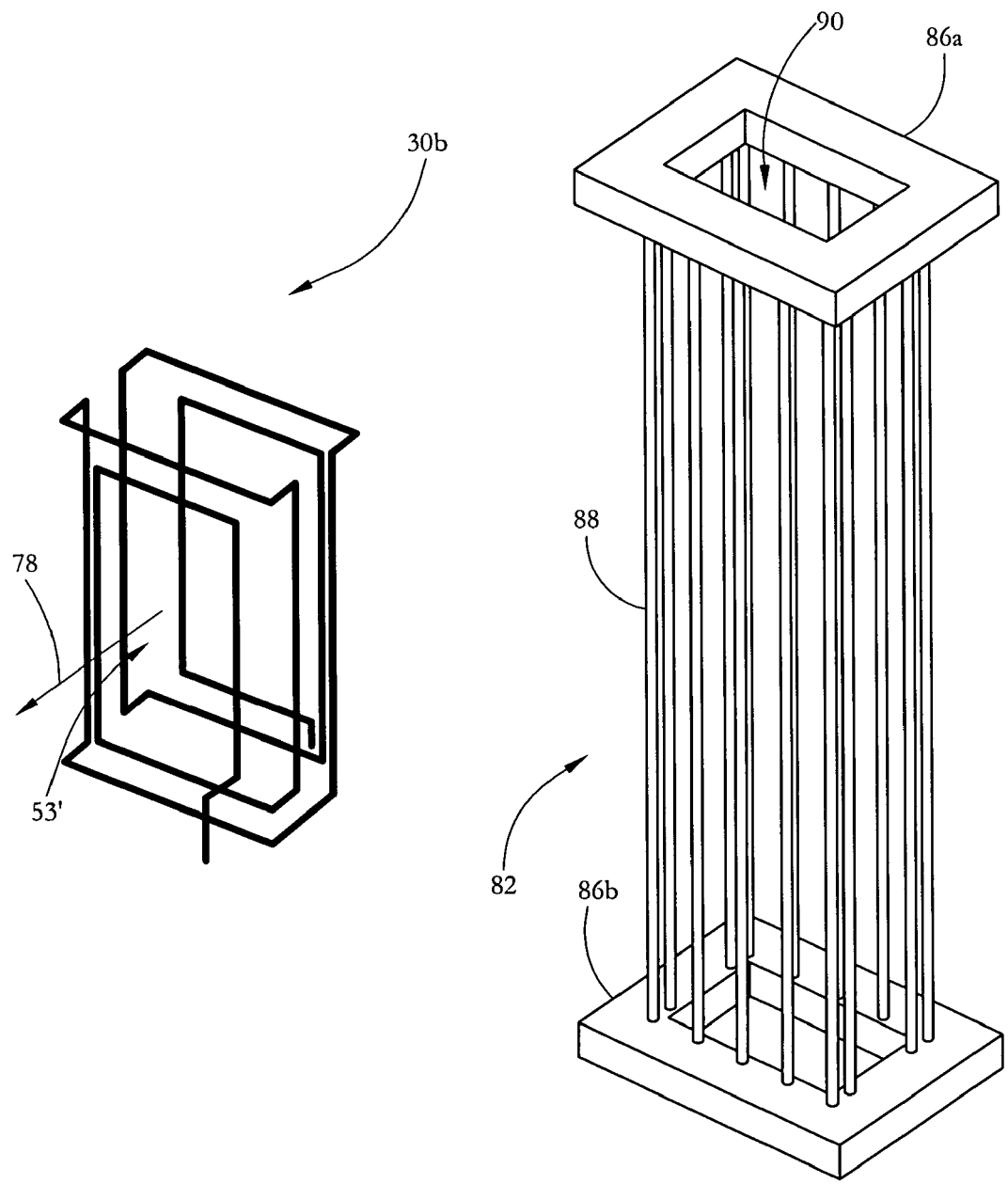
FIG.6-A                    FIG. 6-B

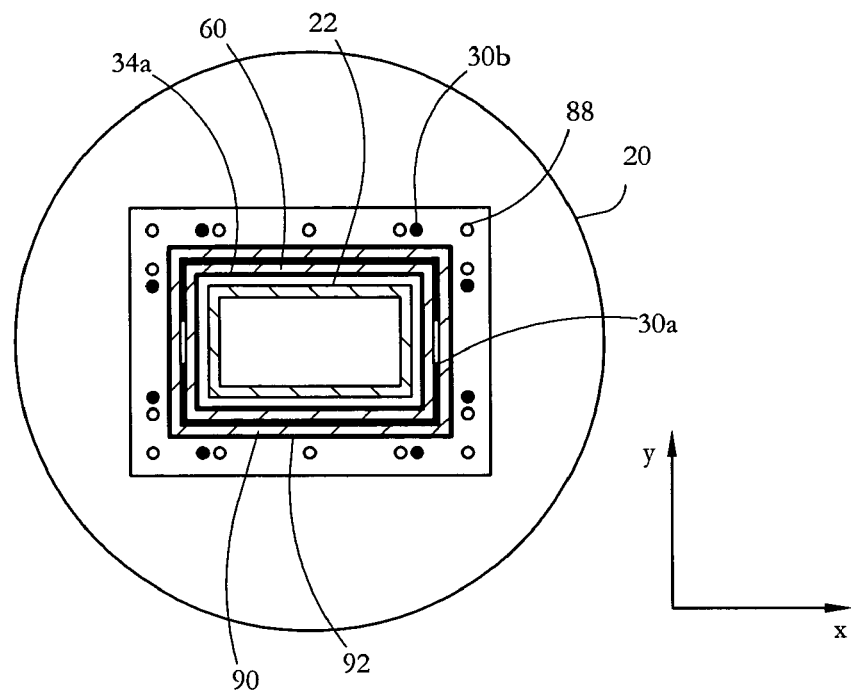
FIG. 7-A
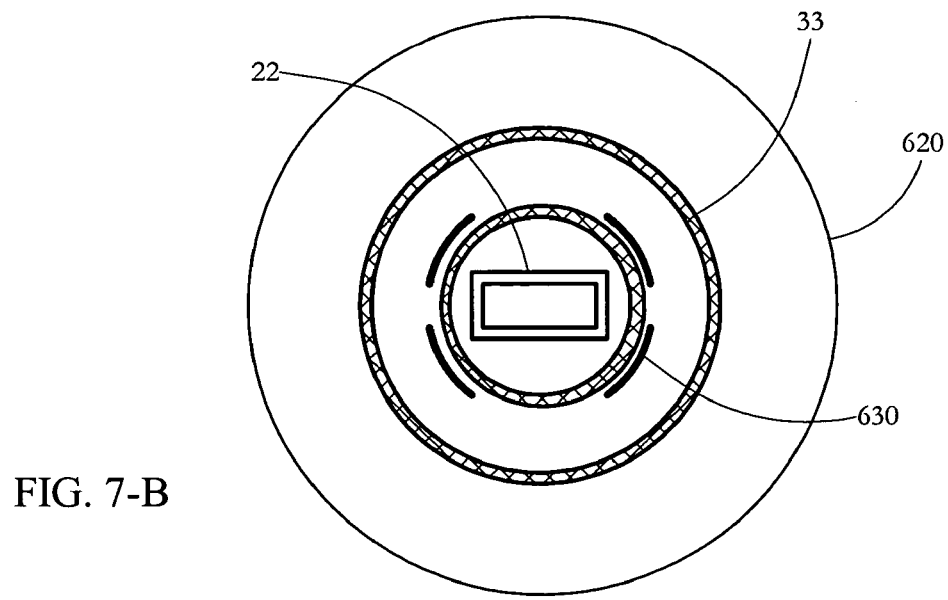
FIG. 7-B

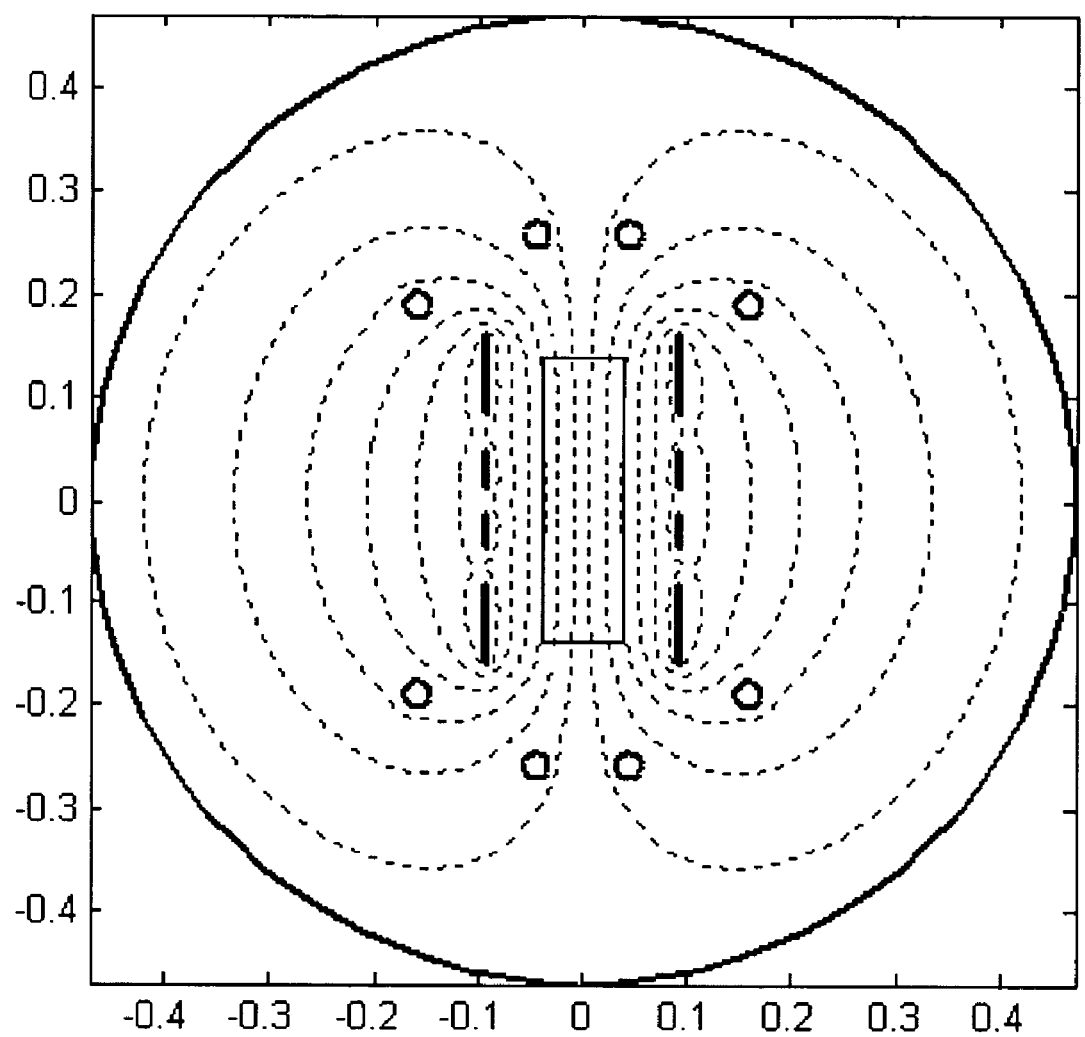
FIG. 9-A

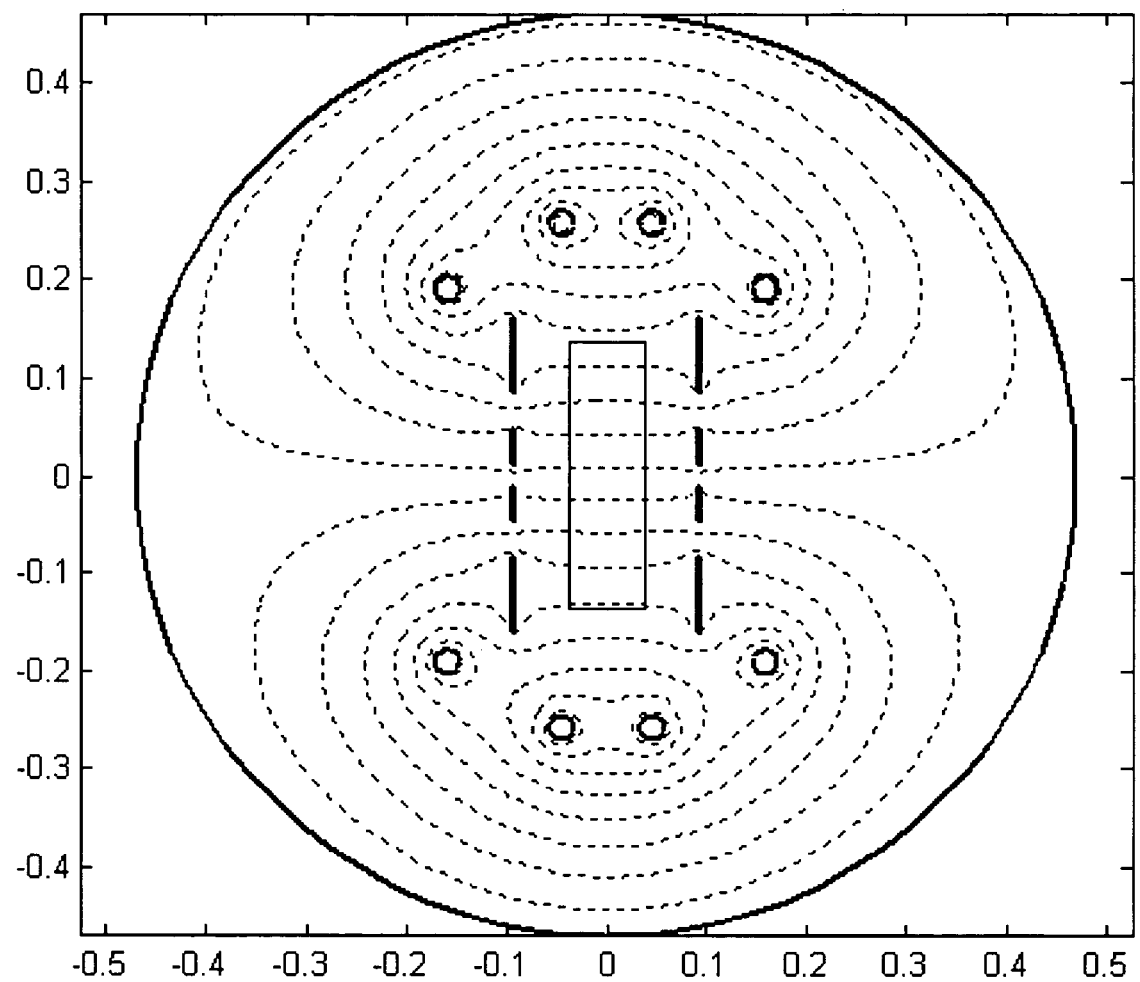
FIG. 9-B

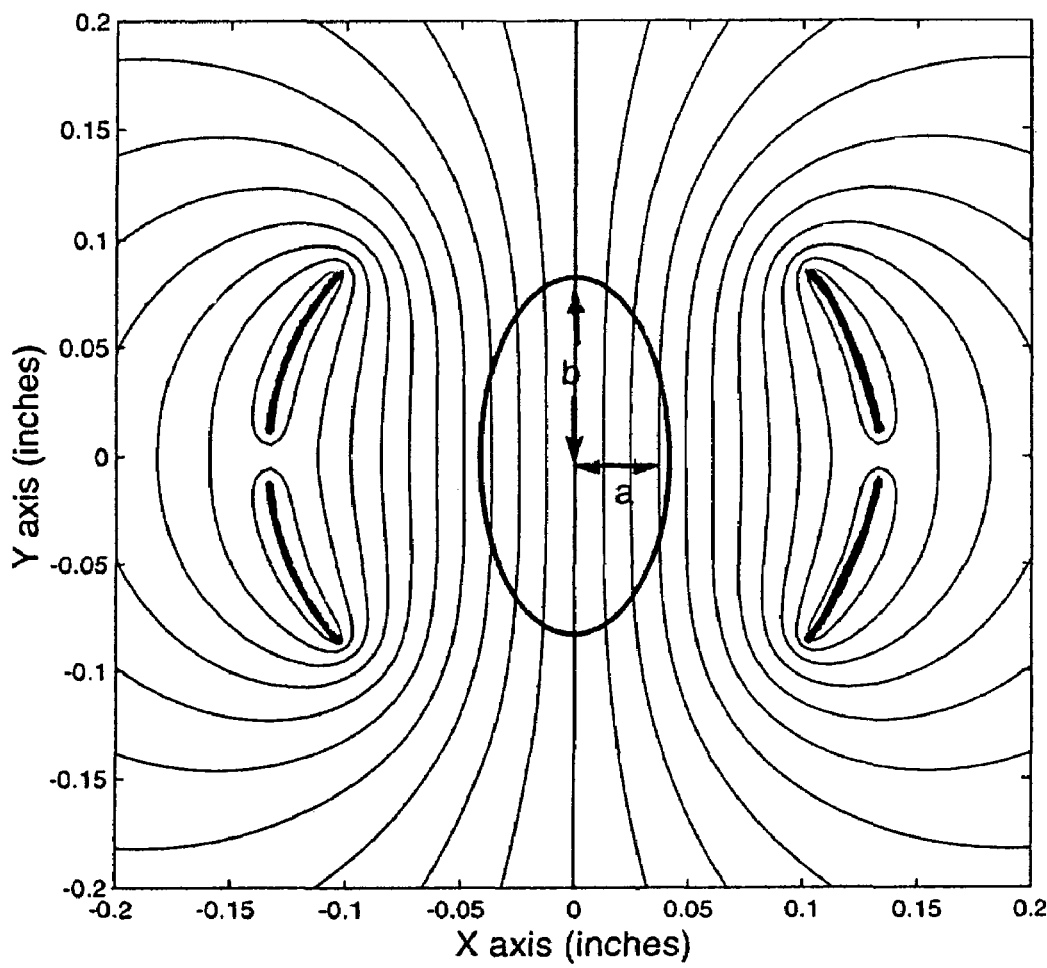
FIG. 9-C

SQUASHED LIQUID NMR SAMPLE TUBES AND RF COILS

FIELD OF THE INVENTION

The invention in general relates to nuclear magnetic resonance (NMR), and in particular to radio-frequency (RF) coils, coil assemblies, and sample vessels for NMR.

BACKGROUND OF THE INVENTION

Nuclear magnetic resonance (NMR) spectrometers typically include a superconducting magnet for generating a static magnetic field $B_0$, and one or more special-purpose radio-frequency (RF) coils for generating a time-varying magnetic field $B_1$ perpendicular to the field $B_0$, and for detecting the response of a sample to the applied magnetic fields. Each RF coil can resonate at the Larmor frequency of a nucleus of interest present in the sample. The resonant frequency of interest is determined by the nucleus of interest and the strength of the applied static magnetic field $B_0$. The RF coils are typically provided as part of an NMR probe, and are used to analyze samples situated in test tubes or flow cells. Conventional NMR magnets and RF coils are characterized by cylindrical symmetry. The direction of the static magnetic field $B_0$ is commonly denoted as the z-axis, while the plane perpendicular to the z-axis is commonly termed the x-y or θ plane. In the following discussion, the term "longitudinal" will be normally used to refer to the z-direction, while the term "transverse" will be used to refer to the x and y directions.

Conventional RF coils used for NMR include helical coils, saddle coils, and birdcage resonators. Conventional RF resonators employed in liquid NMR spectroscopy are designed with care to produce a large cylindrically-symmetric volume of RF magnetic field homogeneity. For information on various NMR systems and methods see for example U.S. Pat. Nos. 4,398,149, 4,388,601, 4,517,516, 4,641,098, 4,692,705, 4,840,700, 5,192,911, 5,818,232, 6,201,392, 6,236,206, and 6,285,189.

An NMR probe can include multiple NMR coils, each tuned for performing NMR measurements on a different nucleus of interest. For example, an NMR probe can include one coil for performing NMR measurements on protons, and another coil for performing NMR measurements on other nuclei of interest, such as $^{13}C$ or $^{15}N$. In such an NMR probe, the design of one coil can affect the performance of the other coil(s). In order to reduce the coupling between two coils, the coils can be disposed in a quadrature configuration, so that the magnetic fields generated by the coils are mutually orthogonal. This configuration minimizes the mutual inductance between the coils.

The measurement sensitivity that can be achieved with an NMR coil increases with the coil quality factor Q and its filling factor n. The quality factor Q can be maximized by reducing coil and sample losses. The filling factor n can be increased by reducing the coil size relative to the sample. At the same time, reducing the coil size relative to the sample can increase magnetic field inhomegeneities. Inhomogeneities in the RF magnetic field adversely affect the measurement sensitivity. Moreover, the coil design and dimensions are constrained by the requirement that the coil resonate in a desired frequency range.

In U.S. Pat. No. 5,552,709, Anderson proposed a method of reducing electrical losses in the sample through the use of special sample cells that compartmentalize the sample. The volume of a cylindrical sample cell is broken up into a plurality of tubular compartments separated by electrically-insulating material. The insulating material reduces the electrical current paths within the sample. The transverse cross-sections of the partitions can be shaped as circles, triangles, rectangles, squares, or sections of cylindrical shells. The described method can be difficult to implement in practice.

SUMMARY OF THE INVENTION

The present invention provides transversely-elongated (squashed) sample vessels, radio-frequency coils, coil supports, coil assemblies, and associated systems and methods allowing reduced RF losses and improved NMR measurement sensitivities. Each sample vessel preferably has an elongated transverse shape matching the transverse shape of the corresponding coil(s). Multiple nested orthogonal coils may be used. The long axis of the sample vessel transverse cross-section preferably coincides with the direction of the RF magnetic field corresponding to a receiver coil of interest. In the preferred embodiment, a saddle-shaped radio-frequency coil for an NMR probe and spectrometer includes a plurality of longitudinal conductors; and a plurality of generally transverse conductors connected to the longitudinal conductors so as to generate a radio-frequency magnetic field oriented along a first transverse direction, wherein a transverse cross-section of the coil formed by the longitudinal conductors and transverse conductors has a generally-squashed (elongated) shape having a larger extent along the first transverse direction than along a second transverse direction perpendicular to the first transverse direction. The first transverse direction coincides with the direction of the RF magnetic field generated by the coil. The coil may have rectangular, rounded (e.g. ellipsoidal) or other squashed (elongated) cross-sections. The direction of the RF magnetic field coincides with the long transverse axis of the sample vessel. Squashed sample vessels may be used with conventional coils having cylindrical symmetry, particularly for low-temperature applications.

BRIEF DESCRIPTION OF THE DRAWINGS

The foregoing aspects and advantages of the present invention will become better understood upon reading the following detailed description and upon reference to the drawings where:

FIG. 1-A is a schematic diagram of an exemplary NMR spectrometer according to the present invention.

FIG. 1-B is a schematic diagram of an exemplary NMR probe of the spectrometer of FIG. 1-A according to the present invention.

FIGS. 2-A and 2-B show isometric views of two exemplary stationary-sample vessel geometries of the present invention.

FIGS. 3-A–C show sectional views of exemplary flow cell configurations according to the present invention.

FIG. 4-A shows an isometric view of a conductive central part of an exemplary squashed RF coil having a rectangular transverse cross-section, according to a preferred embodiment of the present invention.

FIG. 4-B shows an isometric view of a dielectric support for supporting the conductive part of FIG. 2-A.

FIG. 4-C shows an isometric view of two capacitance-enhancing rings suitable for use with the conductive part and dielectric support of FIGS. 2-A–B.

FIG. 6-A shows an isometric view of a saddle-shaped conductive part of an exemplary coil having a rectangular transverse cross-section, suitable for use in conjunction with a coil such as the coils illustrated in FIGS. 4-A and 5, according to the present invention.

FIG. 6-B shows an isometric view of a support for supporting the conductive part of FIG. 6-A, according to the present invention.

FIGS. 7-A–B show transverse sectional views of two exemplary NMR probe geometries according to the present invention.

FIGS. 9-A–B show computed magnetic field lines generated in an exemplary coil configuration comprising two coaxial, mutually-orthogonal RF coils characterized by rectangular symmetry, according to the present invention.

FIG. 9-C shows computed magnetic field lines generated by an exemplary coil characterized by ellipsoidal symmetry, according to the present invention.

DETAILED DESCRIPTION OF THE INVENTION

Figure 5:
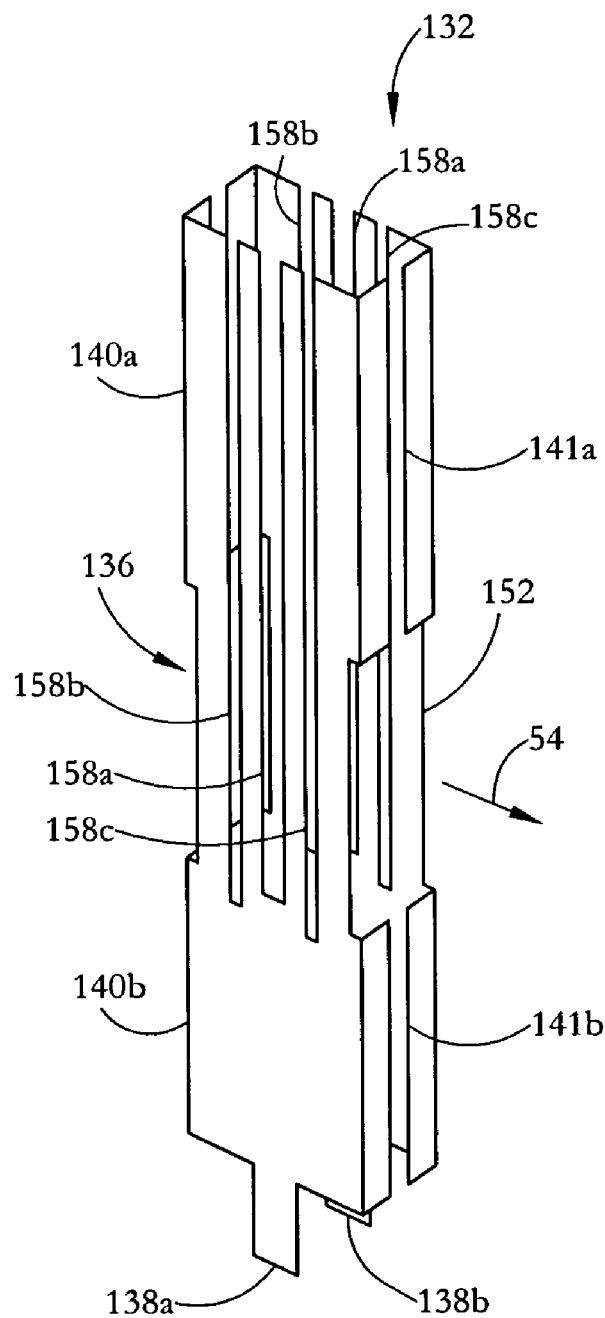
FIG. 5 shows an isometric view of a conductive central part of an exemplary squashed RF coil having a rectangular transverse cross-section, according to another preferred embodiment of the present invention.

In the following description, it is understood that each recited element or structure can be formed by or be part of a monolithic structure, or be formed from multiple distinct structures. A stationary-sample vessel is a vessel such as a test tube through which the sample does not ordinarily flow. A sample may be moved, for example spun, in a stationary-sample vessel. The statement that a coil is mechanically coupled to a sample holder is understood to mean that the coil is held in fixed relation to the sample holder. Such a coil may be directly mounted on the sample holder, indirectly coupled to the sample holder through intermediate support structures. The statement that a first coil is positioned orthogonally with respect to a second coil is understood to mean that the magnetic fields generated by the first and second coils are substantially orthogonal. The statement that a first coil is positioned concentrically with respect to the second coil is understood to mean that the two coils have substantially coincident longitudinal axes. The term "ring" encompasses slotted (discontinuous) rings. Unless explicitly specified otherwise, the term "low temperature" is understood to refer to temperatures lower than 200 K. Unless explicitly limited otherwise, the statement that an NMR coil is "saddle-shaped" is understood to mean that the coil is shaped to generate a magnetic field along a single transverse direction perpendicular to the long axis of the NMR sample and to the long axis of the homogeneous region of the static magnetic field. Saddle-shaped coils are distinct from birdcage coils, which are typically driven in quadrature to generate magnetic fields alternatively along orthogonal directions, and from solenoids. The statement that a coil is used to perform a nuclear magnetic measurement on a sample is understood to mean that the coil is used as transmitter, receiver, or both.

The following description illustrates embodiments of the invention by way of example and not necessarily by way of limitation.

Conventional NMR sample vessels for holding liquid NMR samples and associated RF coils are characterized by cylindrical symmetry. The present invention relies on the observation that the signal-to-noise ratio (SNR) achievable in NMR systems can be improved through the use of appropriately-oriented transversely-squashed sample tubes and, optionally, matching transversely-squashed saddle-shaped RF coils. The SNR improvements can be particularly noticeable where the dominant sink for power dissipation in the NMR probe is the NMR sample itself, as for example in the spectroscopy of high ionic strength aqueous samples in high-Q probes.

Consider a radio-frequency magnetic field B oriented along the y-axis:

$$B_{rf} = B_1 \cos(\omega t)\hat{y}. \quad [1]$$

If the coil is adequately designed, the radio-frequency electric field inside the sample has the form:

$$E_{rf} = -xB_1\omega \sin(\omega t)\hat{z}. \quad [2]$$

Consider a sample vessel of x and y dimensions a and b, respectively, with b the larger dimension aligned with the RF magnetic field (y-axis). The NMR signal is proportional to the cross-sectional area of the sample vessel, ab. The noise in the NMR experiment is proportional to the square root of the power dissipated during a transmitted RF pulse. Consider now a liquid NMR sample for which conduction losses in the sample dominate the dissipated RF power, as is the case typically in low-temperature probes or for salty aqueous samples in high-Q probes. The dissipated power is $$P \propto \int \sigma E^2 dx dy \propto \sigma b a^3, \quad [3]$$

where σ is the sample conductivity, and the integral is carried out over the cross-section of the interior of the sample vessel. The signal-to-noise ratio is then $$S/N \propto \frac{ab}{\sqrt{ba^3}} \propto \sqrt{\frac{b}{a}}. \quad [4]$$

Eq. [3] shows that generally the signal-to-noise ratio (SNR) will improve with larger b and lower a. In practice, increasing the aspect ratio b/a too much may lead to unacceptable loss of sample volume or reductions in the homogeneity of the static and RF magnetic fields. Increasing the aspect ratio b/a may also not be sufficiently beneficial once the power dissipated in the sample becomes comparable to the power dissipated in the RF coils. Generally, an optimal aspect ratio for a given application can be determined/tested empirically.

Employing RF coils having squashed shapes matching the sample vessel shapes allows improving the filling factor of the coils. The coils and sample vessels are preferably arranged such that the magnetic field corresponding to the receive coil is aligned with the major axis of the sample vessel. In a typical arrangement, where the proton channel is used for detection, the receive (proton) coil also corresponds to the highest-sample-loss frequency. The sample losses at the proton resonant frequency are often higher than those at the resonant frequencies of other nuclei (e.g. carbon), since the proton measurements are performed at higher RF frequencies. In such an application, the sample vessel is preferably arranged such that its major axis is aligned with the proton RF magnetic field. If a different nucleus (e.g. a carbon) is used for the receive channel, the RF coils and sample vessels may be aligned to minimize losses at the receive channel resonant frequency, even if sample losses are higher at a different frequency.

Squashed birdcage and gradient coils have been used in the past in MRI applications, in order to fit the coils around non-symmetrical objects such as human body, as described for example in U.S. Pat. Nos. 5,510,714 and 6,479,998. Squashed sample cells and resonant cavities have also been proposed for use in ESR (Electron Spin Resonance), as described for example by Poole in "Electron Spin Resonance: A Comprehensive Treatise on Experimental Techniques," Wiley Interscience, John Wiley & Sons, New York, 1983. Electron spin resonance involves measuring the spin resonance of electrons, which typically occurs at much higher frequencies than nuclear magnetic resonance.

FIG. 1-A is a schematic diagram illustrating a nuclear magnetic resonance (NMR) spectrometer 12 according to a preferred embodiment of the present invention. Spectrometer 12 comprises a magnet 16, an NMR probe 20 inserted in a cylindrical bore of magnet 16, and a control/acquisition system 18 electrically connected to magnet 16 and probe 20. One or more shim coils 32 are coupled to magnet 16. Shim coils 32 may be provided as part of magnet 16, particularly if shim coils 32 are superconducting cryo coils maintained at a low temperature. Shim coils 32 may also be provided separately from magnet 16, particularly if shim coils 32 are adjustable room-temperature coils. Shim coils 32 can be characterized by cylindrical symmetry. One or more gradient coils can be provided as part of probe 20, for generating a magnetic field gradient.

Probe 20 includes a conventional sample holder or sample holding components for holding one liquid NMR sample of interest 22 at a time, while measurements are performed on sample 22. Probe 20 can be a flow-through probe or a stationary-sample probe. In a flow-through probe, sample 22 is typically held in a flow cell. In a stationary-sample probe, sample 22 is typically held in a test tube. In a stationary-sample probe the sample may be spun around the test tube longitudinal axis, as is known in the art. Probe 20 further includes a coil assembly having one or more saddle-shaped radio-frequency (RF) coils 30a–b. Generally, probe 20 may include more than two RF coils. Probe 20 can be a low-temperature probe or a room temperature probe. In a low-temperature probe, coils 30a–b are normally held at a low temperature, e.g. at a temperature lower than the boiling point of nitrogen (78 K).

Magnet 16 applies a static longitudinal magnetic field $B_0$ to sample 22. Shim coils 32 apply a compensatory static magnetic field that reduces the spatial inhomogeneity of the static magnetic field $B_0$ applied to sample 22. Control/acquisition system 18 comprises electronic components for applying desired radio-frequency pulses to probe 20, and acquiring data indicative of the nuclear magnetic resonance properties of the samples within probe 20. Coils 30a–b are used to apply transverse radio-frequency magnetic fields $B_1$ to sample 22, and/or to measure the response of sample 22 to the applied magnetic fields. The same coil can be used for both applying an RF magnetic field and for measuring the sample response to the applied magnetic field. Alternatively, one coil may be used for applying an RF magnetic field, and another coil for measuring the response of the sample to the applied magnetic field. In a common application, sample 22 is excited at multiple frequencies using multiple coils 30a–b, while a signal (e.g. a proton signal) is read at single frequency using only one of coils 30a–b (e.g. inner coil 30a).

Each saddle-shaped RF coil 30a–b is electromagnetically coupled to sample 22, and is electrically connected to control/acquisition system 18. RF coils 30a–b are preferably disposed concentrically relative to the longitudinal axis of probe 20. RF coils 30a–b are disposed mutually orthogonally, in order to generate mutually orthogonal transverse magnetic fields. Each RF coil 30a–b can be mounted on a support made of a material such as quartz or sapphire, chosen not to affect the NMR measurements of interest. Each coil 30a–b is preferably susceptibility-compensated, so as to match the magnetic susceptibility of its environment (typically air of vacuum).

Each RF coil 30a–b can have a different resonant frequency, which can be chosen to match the Larmor frequency of a nucleus on interest. For example, one of coils 30a–b can be tuned to perform $^1H$ NMR measurements, while the other can be tuned to perform $^{13}C$ NMR measurements. Coils 30a–b can be used in general to perform NMR measurement on other nuclei of interest, such as $^{19}F$ and $^{31}P$. In a present implementation, an inner patterned-foil coil 30a as described below is used to perform $^1H$ NMR measurements, while an outer orthogonal wire coil 30b is used to perform $^{13}C$ NMR measurements. In alternative implementations, both coils may be formed from patterned foils or wires. The resonant frequencies of RF coils commonly used with commercially-available NMR magnets range from about 10 MHz to about 1 GHz. Proton resonant frequencies are typically on the order of hundreds of MHz. Resonant frequencies for other nuclei can be lower.

FIG. 1-B shows a more detailed view of probe 20. As shown, probe 20 may include low-temperature control components such as a Dewar 33 for holding coils 30a–b at a low temperature. The low-temperature control components preferably allow maintaining sample 22 at a desired sample temperature, for example room temperature. Probe 20 can also include sample temperature components for controlling the temperature of sample 22. The sample temperature can be controlled for example by flowing a gas (e.g. air) longitudinally along the sample walls. The outer surface of probe 20 preferably has a cylindrical shape matching the corresponding cylindrical shape of the magnet bore. Internal surfaces within probe 20, such as the inner surface of Dewar 33, may have elongated transverse cross-sections matching the cross-section of the sample vessels of interest.

FIGS. 2-A and 2-B show isometric views of two NMR stationary-sample tubes 122, 222 respectively, according to the present invention. Sample tubes 122, 222 are shaped overall as transversely-squashed tubes having uniform transverse cross-sections. Sample tube 122 has a generally-rectangular transverse cross-section, while sample tube 222 has a generally-ellipsoidal transverse cross-section. Sample tube 122 has a five-sided (four planar lateral sides and one bottom) wall 124 which encloses a sample-holding volume 130. Wall 124 defines a rectangular sample tube opening 128 used for inserting and removing the sample of interest to and from sample tube 122. Sample tube 224 has a corresponding ellipsoidal sample tube opening 228. Sample-holding volume 130 is bounded longitudinally by two squashed plugs 126a–b situated on opposite sides of sample-holding volume 130. Plugs 126a–b can be used to center the sample of interest within coil 30a, when the volume of the sample of interest is lower than the total volume contained within wall 124. Plugs 126a–b are preferably magnetic susceptibility-matched to the liquid sample of interest. Sample tube 222 may include similar plugs having ellipsoidal cross-sections. Sample tubes 122, 222 are preferably used with corresponding RF coils and other components having matching shapes and aspect ratios, as described below.

FIG. 3-A shows a schematic longitudinal sectional view of a flow cell 322 according to the present invention. Flow cell 322 defines a squashed sample-holding volume 330 for holding the sample of interest. A sample inlet 328a and a sample outlet 328b are situated on opposite sides of sample-holding volume 330. FIGS. 3-B and 3-C illustrate two suitable shapes for the transverse cross-section of flow cell 322 along sample-holding volume 330. FIG. 3-B shows a flow cell 422 having a generally rectangular transverse cross-section, while FIG. 3-C shows a flow cell 522 having a generally ellipsoidal transverse cross section.

The transverse aspect ratios (the ratio of the two transverse dimensions) of sample vessels such as the vessels 122, 222, 322 are preferably between 1.2 and 10, more preferably between 1.5 and 8, and ideally between 2 and 4. In a present implementation, the transverse inner dimensions of the NMR sample vessels are about 2 mm and 7 mm. For a given sample vessel maximum transverse size, increasing the transverse aspect ratio can allow reduced RF sample losses, as discussed in detail below. At the same time, increasing the aspect ratio too much can lead to unacceptable loss of sample volume and thus signal strength.

The longitudinal extent (length) of the sample vessels is preferably between 4 and 12 inches (10–30 cm), more preferably between 6 and 10 inches (15–25 cm). In a present implementation, the sample vessels are about 8 inches (20 cm) long. Employing too short a sample vessel can lead to suboptimal alignment of the sample vessel within the NMR probe, increased inhomogeneities in the flow of heating gas over the sample vessel, and shimming difficulties. Inhomogeneities in heating gas flow can lead to spatial inhomogeneities in the sample temperature, while suboptimal shimming can lead to spatial inhomogeneities in the static magnetic field. The sample-holding volume defined by the sample vessels is preferably on the order of several cm long. The sample vessels are preferably made of NMR-compatible materials such as quartz, sapphire, or borosilicate glass (e.g. pyrex®).

Squashed sample vessels as described above are preferably used with RF coils and associated components having matching cross-sections, as illustrated below. Using matching cross-sections for the coils and sample vessels allows achieving improved filling factors, which generally allows improved signal-to-noise ratios (SNR). Squashed sample vessels may also be used with conventional, cylindrical RF coils and associated components, particularly for low-temperature applications where sample losses dominate. In such applications, coil losses are relatively low, and improved SNRs for NMR measurements can be achieved with squashed sample vessels even if the coil filling factors are not maximized.

FIG. 4-A shows an isometric view of an electrically-conductive central structure 32 of squashed (transversely-elongated) saddle-shaped radio-frequency (RF) coil 30a according to a presently preferred embodiment of the present invention. Central structure 32 has an overall shape of a transversely-squashed tube matching the shape of the sample vessel employed with central structure 32. Saddle-shaped coil 30a generates an RF magnetic field directed along a single direction 54 perpendicular to the static magnetic field $B_0$ and to the longitudinal axis of the sample. Direction 54 is perpendicular to the direction of the RF magnetic field generated by saddle-shaped RF coil 30b (shown in FIGS. 1-A–B). Central structure 32 is mounted on a squashed dielectric support 60, illustrated in FIG. 4-B. Coil 30a includes central structure 32, dielectric support 60, and a pair of squashed, conductive capacitance-enhancing floating shields 34a–b shown in FIG. 4-C. Shields 34a–b are disposed on opposite longitudinal sides relative to the center of central structure 32. The central axis of each shield 34a–b is aligned with the longitudinal central axis of central structure 32. Central structure 32 and shields 34a–b are preferably disposed on opposite sides of support 60. For example, central structure 32 can be mounted on the outside of support 60, and shields 34a–b can be mounted on the inside of support 60. Shields 34a–b may be continuous, as shown in FIG. 4-C, or may include longitudinal slots for increasing the penetration of the orthogonal RF magnetic field generated by RF coil 30b. For information on cylindrical shields described for use with prior art cylindrical coils see for example Hill et al., U.S. Pat. No. 5,192,911, and Behbin, U.S. Pat. No. 6,008,650.

A squashed measurement volume 36 is defined in the center of central structure 32, between shields 34a–b. The measurement volume 36 sequentially accommodates NMR samples of interest held in squashed sample tubes or flow cells. Shields 34a–b are capacitively coupled to central structure 32 along at least part of the surfaces of shields 34a–b adjacent to measurement volume 36. Shields 34a–b can be used to reduce the parasitic excitation of the NMR samples due to RF pickup from coil leads or other conductive structures, and to shield the NMR samples from undesired external electric fields. Shields 34a–b also provide additional distributed capacitance to coil 30a.

Central structure 32 includes a pair of external longitudinal leads 38a–b extending longitudinally away from measurement volume 36. Leads 38a–b provide an electrical connection to control/measurement electronics 18 (shown in FIG. 1). Central structure 32 further includes a pair of squashed transverse conductors (rings) 40a–b, and a set of longitudinal conductors 52 interconnecting rings 40a–b. In a transverse cross-section, the positions of conductors 52 preferably define an elongated perimeter. Rings 40a–b are disposed on opposite sides of measurement volume 36. A plurality of elongated, longitudinal conductive segments (rungs, conductors) 52 interconnect rings 40a–b. Longitudinal segments 52 extend along measurement volume 36 between rings 40a–b. In the configuration shown in FIG. 4-A, ring 40b includes a pair of longitudinal slots 41 facing direction 54.

Rings 40a–b and segments 52 form two loops facing each other along a transverse (x- or y-) direction, for generating an RF magnetic field along direction 54. Current flows through the two loops in the same direction (clockwise or counterclockwise), such that the RF magnetic fields generated by the two loops reinforce each other. The RF current in each loop flows around a corresponding coil window 53 facing direction 54. As an external voltage is applied over leads 38a–b, current flows from lead 38a through ring 40a–b and longitudinal segments 52 to lead 38b. The alternating current flowing around ring 40b is capacitively coupled across longitudinal slots 41 by shield 34b. The current flow through coil 30a generates a transverse RF magnetic field along direction 54.

A plurality of pairs of elongated, generally longitudinal slots 58a–c are formed between segments 52. A central pair of slots 58a extends between segments 52 and through ring 40a. Slots 58a–c face a transverse direction orthogonal to the direction 54. The two slots in each pair are disposed symmetrically with respect to the central axis parallel to direction 54. Slots 58a–c serve to reduce the obstacle formed by conductors 52 to the magnetic field lines generated by the orthogonal coil 30b. Preferably, the approximate location and number of slots 58a–c are chosen so as to provide improved magnetic field homogeneity and increased penetration of the magnetic field generated by orthonogal coil 30b.

The shape and orientation of slots 58a–c are preferably chosen such that the local orientation of slots 58a–c tracks the local direction of RF current flow within coil 30a, so as to minimize the impact of slots 58a–c on the RF current passing through coil 30a, and thus maintain a high Q factor for coil 30a. Preferably, a pair of central slots 58a extend longitudinally from the inner side of ring 40b, along volume 36 and ring 40a, to the outer edge of ring 40a. In general, slots such as slots 58a–c may extend over ring 40b, to the outer side of ring 40b. Two pairs of lateral slots 58b–c extend longitudinally along central volume 36, and then curve transversely (horizontally in FIG. 4-A) along the inner side of ring 40a. The curvature of slots 58b–c is chosen to track the local direction of current flow through segments 52 and around ring 40a. It was observed that in an arrangement such as the one in FIG. 4-A, in which ring 40a does not include longitudinal slots facing direction 54, making lateral slots 58b–c curve around the RF magnetic field window allows achieving reduced RF coil losses and improved Q values.

Central structure 32, which includes rings 40a–b and longitudinal conductors 52, is preferably formed from a single susceptibility-compensated thin sheet. For example, central structure 32 and shields 34a–b may be made of susceptibility-compensated palladium-plated copper about 0.002 inches thick. In general, other materials such as aluminum, platinum, copper and stacks of such materials are suitable for central structure 32 and shields 34a–b. For example, an Al—Cu susceptibility-compensated sandwich may be used. Other materials having susceptibilities of opposite signs may be used to yield a magnetic susceptibility for coil 30a equal to the magnetic susceptibility of air or vacuum. To make coil 30a, a suitable pattern is first cut by well-known methods into a flat sheet of a desired material or materials. The flat pattern is then disposed around a glass or quartz tube to form the squashed rings 40a–b of coil 30a.

In a present implementation, the overall transverse size of rings 40a–b and shields 34a–b is on the order of 1 cm, and the transverse size of each longitudinal conductor 52 is about 1 mm. For typical NMR applications, transverse coil sizes for coil 30a can range from a few millimeters to a few centimeters, and the transverse sizes of longitudinal conductors 52 can range from tenths of mm to a few mm. The longitudinal extents of longitudinal conductors 52 and rings 40a–b can be on order of a few cm.

FIG. 4-B shows an isometric view of a dielectric coil support 60 suitable for supporting the conductive part of coil 30a. Support 60 is shaped as a hollow shell, and has a longitudinal inner bore 66 for receiving the sample tubes or flow cells of interest. Inner bore 66 extends from the top end to the bottom end of support 60. Support 60 has a longitudinal outer surface 62, and a longitudinal inner surface 64. Shields 34a–b (shown in FIG. 2-C) are attached to and abut inner surface 64. Central structure 32 (shown in FIG. 2-A) is attached to and abuts outer surface 62. Support 60 is preferably made of a dielectric material that does not interfere with NMR measurements, such as quartz or sapphire. Support 60 is secured at its longitudinal ends to the structure of the probe containing coil 30a. Support 60 may be formed from a single monolithic piece, or from four assembled planar pieces.

The transverse cross-sections of central structure 32, support 60, and shields 34a–b are preferably generally shaped as rectangles matching the aspect ratio of the sample vessels to be used. In alternative embodiments, the transverse cross-sections may have generally-rounded shapes, for example ellipsoidal shapes. The aspect ratios (ratio of length to width) of the general shapes are preferably between about 2:1 and 4:1. Lower or higher aspect ratios, such as 1.2:1–1: 5:1, 1.5:1–2:1, or 4:1–10:1, may be used.

FIG. 5 shows an isometric view of a central conductive part 132 of an RF coil according to another preferred embodiment of the present invention. The RF magnetic field generated by the coil is oriented along direction 54. Central part 132 can be used in conjunction with a dielectric support and capacitance-enhancing shield such as the ones shown in FIGS. 4-B–C. Central part 132 includes two conductive rings 140a–b disposed on opposite longitudinal sides of a measurement volume 136. Rings 140a–b are interconnected by a plurality of longitudinal conductive segments 152. Each ring 140a–b includes a pair of longitudinal slots 141a–b, respectively. Slots 141a–b face direction 54.

A plurality of pairs of longitudinal slots 158a–c are defined between segments 152 and through ring 140a. Longitudinal slots 158a–c extend linearly from the inner side of ring 140b, along volume 136 and ring 140a, to the outer edge of ring 140a. Linear slots such as the ones shown in FIG. 5 are preferably used in RF coils which include slots 141a. It was observed that such linear slots match the actual RF current distribution within conductive part 132, thus allowing reduced coil losses.

FIG. 6-A shows a schematic isometric view of the conductive part of a multi-turn saddle-shaped RF coil 30b suitable for use in a coil assembly in conjunction with coil 30a (shown in FIGS. 4-A–C). Coil 30b is preferably disposed coaxially with coil 30a. The conductor of FIG. 6-A can be formed from a conventional susceptibility-compensated wire, which loops around an RF magnetic field window 53'. The direction of the transverse RF magnetic field generated by coil 30b is illustrated by the arrow 78. The magnetic field generated by coil 30b is orthogonal to the magnetic field generated by coil 30a (illustrated at 54 in FIG. 4-A). Similarly, magnetic field window 53' is orthogonal to the window 53 of coil 30a.

FIG. 6-B shows an isometric view of a coil support 82 suitable for supporting the conductor of coil 30b. Coil support 82 includes two parallel transverse mounting plates 86a–b, and a plurality of longitudinal rods 88 connecting mounting plates 86a–b. Mounting plates 86a–b have corresponding aligned central apertures defining an internal coil space 90 for receiving coil 30a and the sample of interest. Longitudinal rods 88 are arranged around the central apertures of mounting plates 86a–b. The positions of longitudinal rods 88 define a squashed perimeter. Each longitudinal conductor of the wire shown in FIG. 6-A is attached to one of the longitudinal rods 88 at one or more points. Mounting plates 86a–b are secured to the structure of the probe containing coil 30b.

Preferably, in order to optimize the filling factor of coil 30b and the use of space within the NMR probe, coil 30b generally matches coil 30a in overall transverse shape and aspect ratio. For example, if coil 30a has a rectangular cross-section, coil 30b is preferably chosen to have a rectangular cross-section of a similar aspect ratio. If coil 30a has an elliptical cross-section, coil 30b is preferably chosen to have an elliptical cross-section. In general, however, coil 30b may have a circular cross-section or some other cross-section that does not match that of coil 30a.

Aligning the direction of the RF magnetic field generated by coil 30*b* with the minor axis of the squashed sample vessel can lead to increased sample losses at the resonant RF frequency of coil 30*b*. Such sample losses may have diminished significance if coil 30*b* is only used for sample excitation and not detection, and if the sample losses at the resonant frequency of coil 30*b* are lower than the sample losses at the resonant frequency of coil 30*a*. In a typical implementation in which the proton channel is used for detection, the sample vessel and the coils are preferably aligned such that the long transverse axis of the sample vessel coincides with the direction of the RF magnetic field of the proton coil. Such an alignment is also useful because sample losses at the proton frequency are typically higher than at the resonant frequencies of other nuclei. If a channel other than the proton channel (e.g. a carbon channel) is used for detection, the long transverse axis of the sample vessel can be aligned to coincide with the direction of the RF magnetic field of that channel (e.g. the direction of the RF magnetic field of the carbon coil), even though the sample losses are not highest at the carbon frequency.

FIG. 7-A is a top schematic view of probe 20, illustrating the stacking of the various components of probe 20. Moving outward in sequence from sample vessel 22, FIG. 7-A shows shield 34*a*, coil support 60, the conductive part of coil 30*a*, an additional dielectric support 90, an additional shield ring 92, support rungs 88, and the conductive part of coil 30*b*. Dielectric support 90 preferably presses down the conductive part of coil 30*a* so as to secure the conductive part in place. Preferably, additional shield ring 92 can be slid longitudinally relative to the conductive part of coil 30*a*, in order to tune the capacitance of the coil and thus control the resonance frequency of coil 30*a*.

FIG. 7-B is a top schematic view of a probe 620 according to another embodiment of the present invention. Probe 620 includes a dewar 33 for keeping a radio-frequency coil 630 at low temperature. Sample vessel 22 is maintained at room temperature within an inner bore of dewar 33. As shown, coil 630 may be a conventional saddle-shaped RF coil characterized by cylindrical symmetry. Since coil 630 is kept at a low temperature, the RF losses within coil 630 are typically much smaller than the losses within the sample held in sample vessel 22. While an assembly including cylindrical RF coil(s) and a cylindrical dewar as shown in FIG. 7-B is suitable for use in a low-temperature probe, a low temperature probe can also benefit from the use of transversely-elongated RF coils as described above, and a transversely-elongated Dewar having a matching shape.

Figure 8:
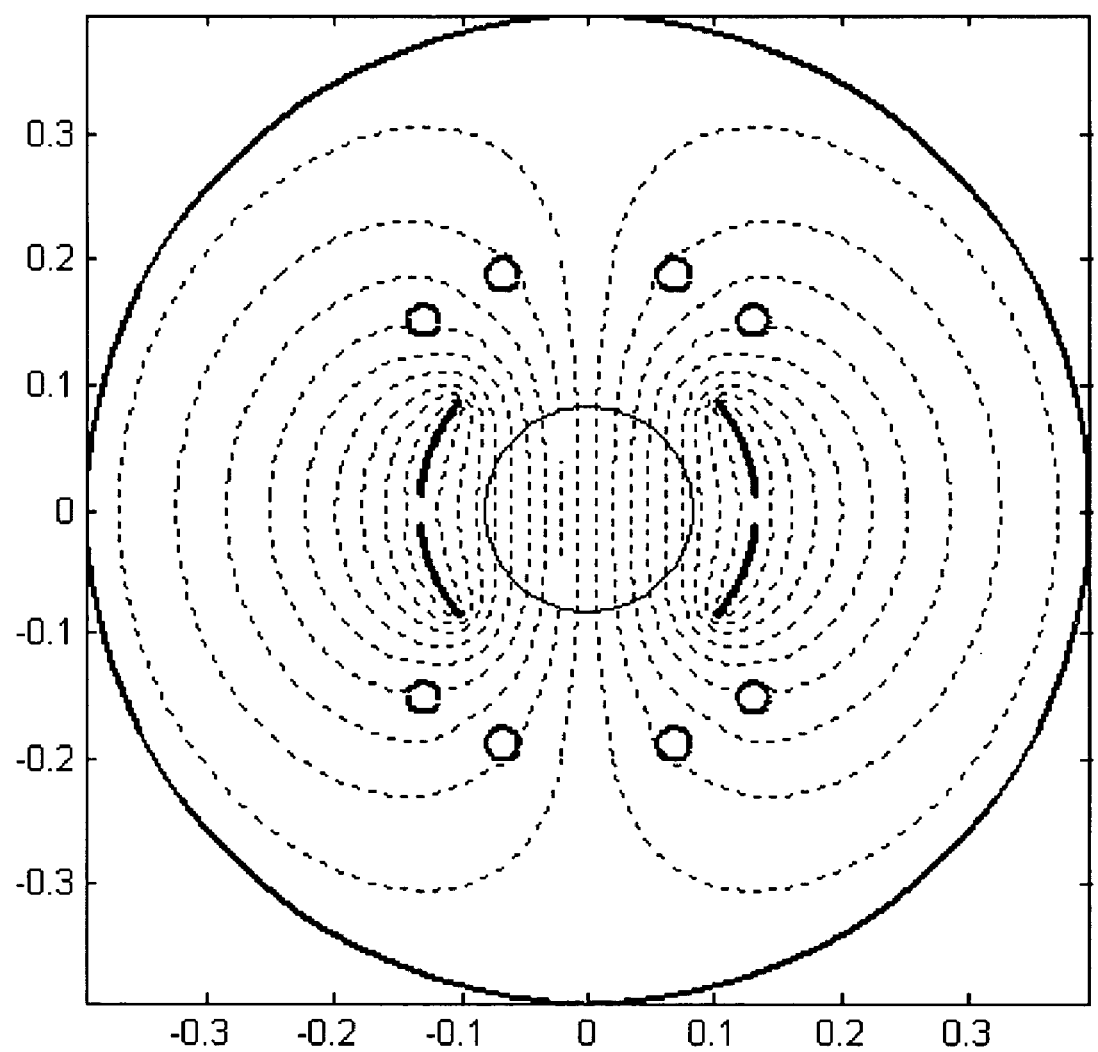
FIG. 8 illustrates in a transverse sectional view computed magnetic field lines generated in an exemplary coil configuration characterized by cylindrical symmetry, according to the present invention.

FIG. 8 illustrates in a transverse view computed magnetic field lines for a conventional coil and sample vessel characterized by cylindrical symmetry. FIGS. 9-A and 9-B show magnetic field lines computed for a squashed rectangular vessel/coil arrangement as described above. FIG. 9-A shows the magnetic field lines corresponding to the inner coil, while FIG. 9-B illustrates the magnetic field generated by the outer coil. The aspect ratio of the illustrated sample vessel is about 3.5:1. The homogeneity of the magnetic fields shown in FIGS. 9-A–B is comparable to that achieved using the conventional geometry of FIG. 8. At the same time, the power dissipation in the arrangement of FIGS. 9-A–B can be improved by a factor of 3 or more, as described below. FIG. 9-C shows similar data for a squashed ellipsoidal vessel/coil arrangement as described above.

Figure 10:
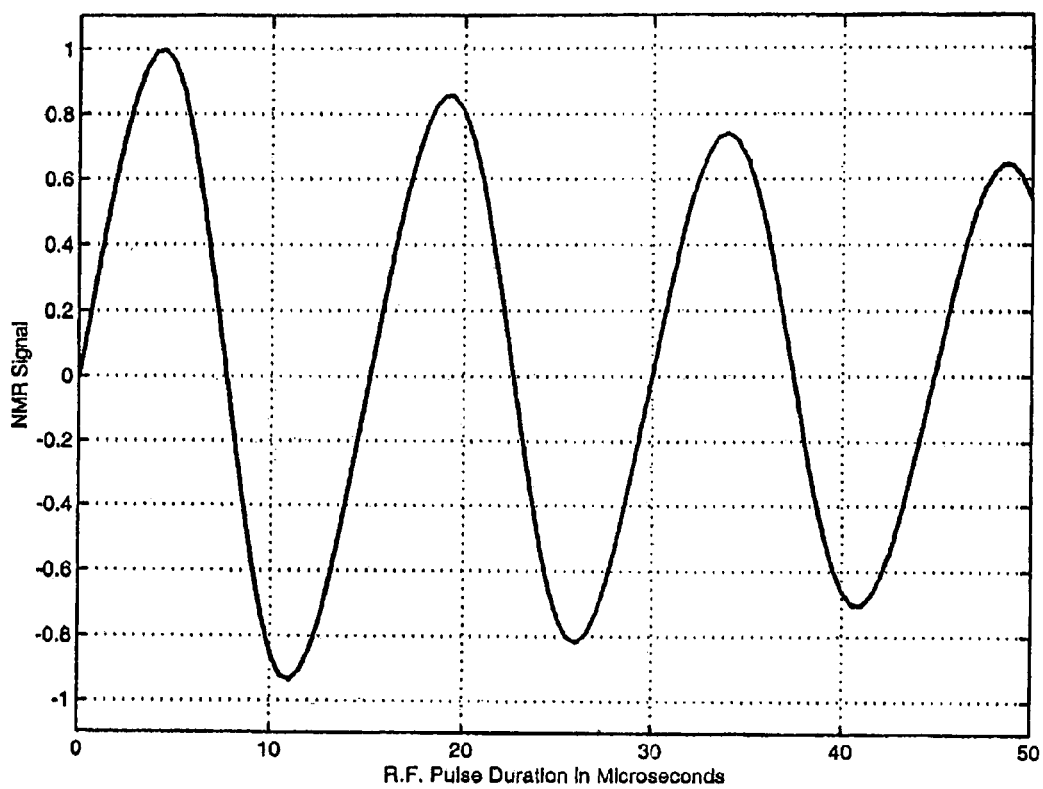
FIG. 10 shows a nutation plot for an exemplary NMR probe including a rectangular RF coil and sample vessel, according to the present invention.

FIG. 10 shows an NMR nutation plot generated using a rectangular sample vessel having inner dimensions of 2 mm×7 mm, and matching rectangular RF coil of the design shown in FIG. 5. The sample was 1% $H_2O$ in 99% $D_2O$. The NMR probe and single coil were double tuned to proton and deuterium lock. The deuterium signal was used for lock. The data shown is proton data at 800 MHz. The slow decay of the NMR signal amplitude with increasing pulse duration indicates the RF magnetic field of the coil is relatively uniform spatially.

The squashed vessel/coil arrangements described above allow reducing sample and/or coil losses, and thus allows higher quality (Q) factors for NMR measurement circuits. Improved NMR measurement performance is achievable when the physical cross-section of the sample is elongate in one transverse dimension relative to the other. A suitably-designed saddle-shaped RF coil of substantially conformal transverse cross-section, in combination with a squashed sample, can yield high Q values and consequent increases in signal-to-noise ratios. The performance improvement is particularly significant for samples having high electrical conductivity, such as aqueous samples with significant salt concentrations, and in other NMR systems in which sample losses are of particular concern, such as low-temperature NMR systems.

It will be clear to one skilled in the art that the above embodiments may be altered in many ways without departing from the scope of the invention. A coil of the present invention need not have exactly four longitudinal conductors. Higher or lower numbers of longitudinal conductors may be used, depending on the particular desired coil shape and number of coil turns. Accordingly, the scope of the invention should be determined by the following claims and their legal equivalents.

What is claimed is:

1. An NMR probe for coupling an RF circuit to nuclei of a sample, said probe comprising,
   a sample containing vessel, said vessel having an extension along a symmetry axis, z, and a cross section $\sigma(x,y)$ transverse to said axis z, wherein said cross section $\sigma(x,y)$ has an aspect ratio x/y greater than 1.2, and
   an RF resonator comprising a saddle coil surrounding said sample containing vessel for coupling RF energy between said sample in said sample vessel and said RF circuit.

2. The NMR probe of claim 1 wherein said saddle coil comprises a symmetry axis z' aligned coincident with said axis z and said saddle coil supports an RF current distribution wherein said RF current is distributed in the plane transverse to z' in accord with a functional shape $S(x,y)$.

3. The NMR probe of claim 2 wherein said shape $S(x,y)$ has an aspect ratio of substantially unity.

4. The NMR probe of claim 2 wherein said functional shape $S(x,y)$ has an aspect ratio x/y in the range $1.2 \leq x/y \leq 10$.

5. The NMR probe of claim 4 wherein said functional shape $S(x,y)$ is geometrically similar to said cross section $\sigma(x,y)$ and oriented with corresponding axes in alignment.

6. The NMR probe of claim 5 wherein said functional shape $S(x,y)$ is generally ellipsoidal.

7. The NMR probe of claim 5 wherein said functional shape $S(x,y)$ is generally rectangular.

8. The NMR probe of claim 5 wherein said functional shape $S(x,y)$ is generally rounded.

9. The NMR probe of claim 2, wherein said cross section $\sigma(x, y)$ has a major axis, x and said RF saddle coil produces an RF magnetic field substantially along said major axis x.

10. The method of coupling an RF circuit to a sample for NMR analysis comprising the steps of a) imposing a unidirectional polarizing field on said sample,
b) confining said sample to occupy a volume having a long axis z, parallel with said polarizing field and said volume further characterized by a cross section σ(x,y) transverse to z wherein x/y≧1.2,
c) orienting a RF magnetic field coupled to said sample along said x axis whereby the greater thickness of said sample is interposed along the direction of said RF magnetic field.

* * * * *